Figure 1:
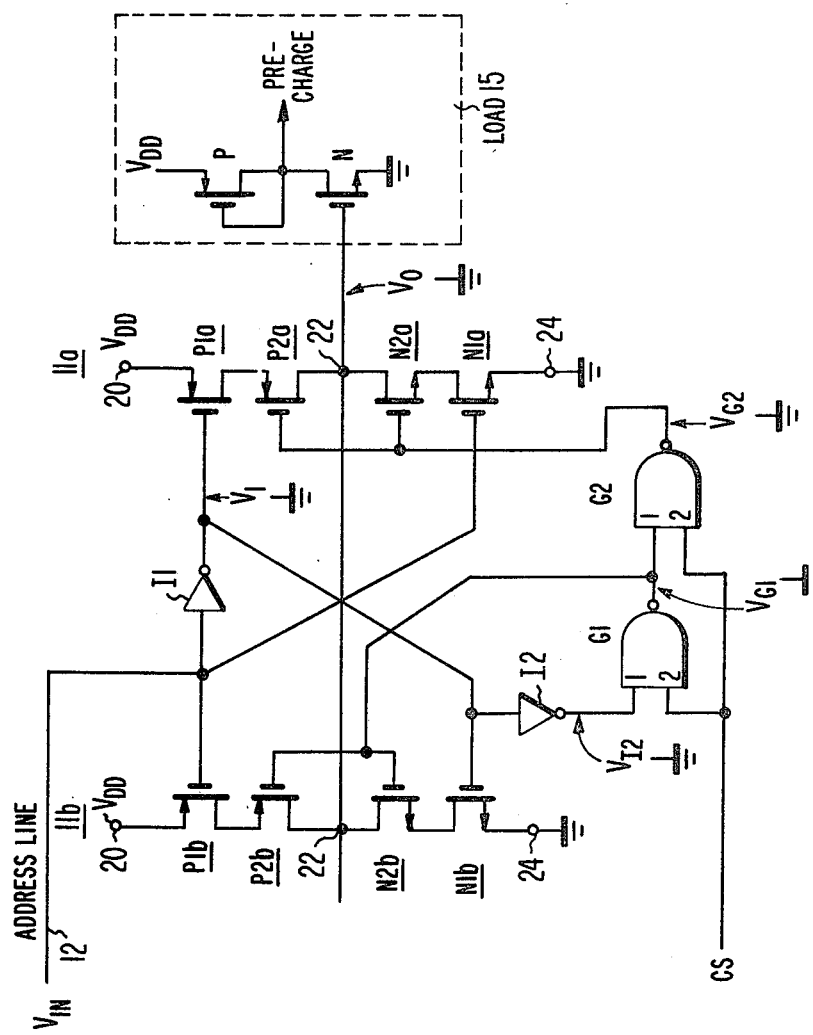

United States Patent [19]

Dingwall

[11] 4,286,174
[45] Aug. 25, 1981

[54] TRANSITION DETECTOR CIRCUIT
[75] Inventor: Andrew G. F. Dingwall, Bridgewater, N.J.
[73] Assignee: RCA Corporation, New York, N.Y.
[21] Appl. No.: 80,702
[22] Filed: Oct. 1, 1979
[51] Int. Cl.$^3$ .................................... H03K 17/60
[52] U.S. Cl. .................... 307/242; 307/354; 307/362; 307/584
[58] Field of Search .............. 307/242, 251, 354, 360, 307/362, 363

[56] References Cited
U.S. PATENT DOCUMENTS
3,252,011  5/1966  Zuk.
4,039,858  8/1977  Stewart ........................... 307/231

Primary Examiner—James B. Mullins
Attorney, Agent, or Firm—Samuel Cohen; Henry I. Schanzer

[57] ABSTRACT

A circuit for detecting the transitions of an input signal between first and second voltage levels includes first and second signal paths connected between a first point of operating potential and an output point. Each signal path includes first and second transistors having their conduction channels connected in series. In response to an input signal of the first level the first transistor of one path is turned on while the first transistor of the other path is turned off and in response to an input signal of the second level the first transistor of the one path is turned off while the first transistor of the other path is turned on. The second transistor of each path is turned off a first time delay after the first transistor of that path is turned on and is turned on a second time delay after the first transistor of that path is turned off. Consequently, one signal path produces a relatively low impedance conduction path for input signal transitions of one polarity during the first time delay and the other signal path produces a relatively low impedance conduction path for input signal transitions of opposite polarity during the second time delay.

8 Claims, 4 Drawing Figures

TRANSITION DETECTOR CIRCUIT

This invention relates to means for detecting the transition of a signal from one level to another.

There are many applications where the transitions of a signal must be sensed to initiate an operation, or a series of operations. For example, in a memory array, it is desirable and/or necessary to sense changes in the address line information in order to signal the memory and associated circuitry that information is going to be written into the memory, or that information is going to be read out of the memory, and that certain housekeeping functions, such as the precharge or discharge of portions of the array, be taken care of prior to, or after, a write or a read operation. The information on the address lines is then normally decoded and determines which bit or word of the memory will have information written into or read-out from. In the above and other applications it is desirable to have a transition sensing or detecting circuit which responds very quickly to the rise times and fall times of the input signals, which is reliable, requires few components, and is relatively simple.

Circuits embodying the invention include first and second signal paths connected in parallel between a first point of operating potential and an output point. Each signal path includes first and second switching means and provides a relatively low impedance conduction path between the first point and the output point when both of its switching means are enabled. In response to one value of the input signal, the first switching means of one path is enabled and the first switching means of the other path is disabled. In response to another value of the input signal the first switching means of the one path is disabled and the first switching means of the other path is enabled. The circuit also includes means for disabling the second switching means in each path a first time delay after the first switching means of that path is enabled and for enabling the second switching means a second time delay after the first switching means of that path is disabled. These circuits are well suited to quickly detect transitions of the input signal between the one and other values since only one switching means has to be enabled per transition of the input signal between levels.

Figure 2A:
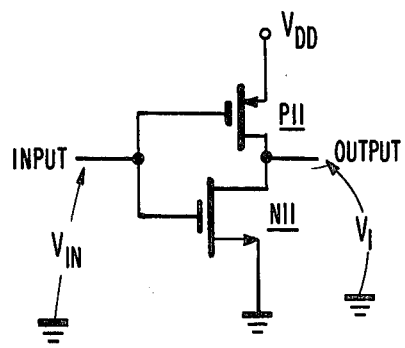
Figure 2B:
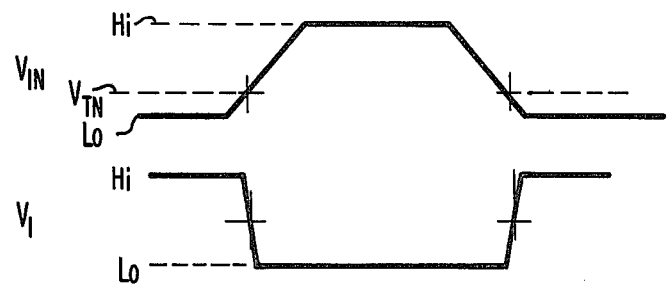
Figure 3:
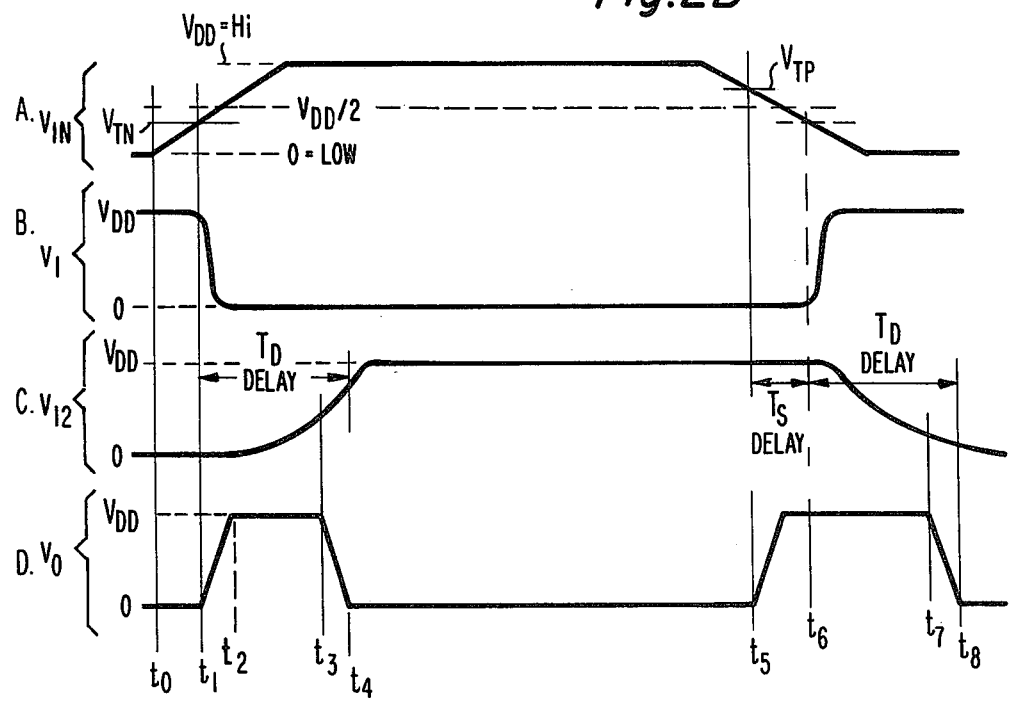

In the accompanying drawing like reference characters denote like components; and FIG. 1 is a partial schematic partial block diagram of a circuit embodying the invention, FIG. 2A is a schematic diagram of a complementary inverter suitable for use in the circuit of FIG. 1;

FIG. 2B is a diagram of input and output waveforms associated with the circuit of FIG. 2A; and FIG. 3 is a diagram of waveforms associated with various points of the circuit of FIG. 1.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential appled thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude then a given value, which is defined as the threshold voltage ($V_T$) of the transistor. To turn on a P type transistor its gate voltage ($V_G$) has to be more negative than its source voltage ($V_S$) by at least $V_T$. To turn on a N type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

Also, in the discussion to follow it will be convenient to discuss operation in Boolean terms. The convention arbitrarily adopted is that a relatively more positive voltage (i.e. at, or near, $V_{DD}$) represents the binary digit 1 also called "high" or "hi" and the relatively less positive voltage (i.e. at, or near ground) represents the binary digit 0 also referred to as "low" or "lo". To further simplify the explanation of the circuit operation it will sometimes be stated that a 1(high or hi) or a 0 (low or lo) is applied to a circuit or obtained from a circuit rather than stating that a voltage which is indicative of a 1 or 0 is applied or derived from a circuit.

The circuit of FIG. 1 includes a first string (11a) of 4 transistors for sensing "early" the rise of a positive going input signal, and a second string 11b of 4 transistors for sensing "early" the fall of a negative going input signal. The transistors in string 11a include the postscript "a" in their reference characters and the transistors in string 11b include the postscript "b" in their reference characters.

Each string includes two transistors of P conductivity type (P1a and P2a; P1b and P2b) having their conduction paths connected in series between a first power terminal 20 and a circuit output terminal 22, and two transistors of N conductivity type (N1a and N2a, N1b and N2b) having their conduction paths connected in series between terminal 22 and terminal 24. Ground or zero volts is applied to terminal 24 and $V_{DD}$ volts which is positive (e.g. 5 volts) with respect to ground is applied to terminal 20.

Input signals generated by an external source (not shown) are applied to the circuit via an address line 12. The input signals ($V_{IN}$) as shown in waveform A of FIG. 3 vary between a first level (also identified as 0 volts, ground, or "low") and a second level (also identified as $V_{DD}$ volts, or "high").

The input line 12 is connected to the gate electrodes of transistors N1a and P1b and to the input of an inverter I1. The output of inverter I1 is connected to the gate electrodes of transistors P1a and N1b and to the input of an inverter I2.

The output of I2 is connected to the one (1) input of two-input NAND gate G1, and the output of G1 is connected to the gate electrodes of transistors N2b, and P2b and to the one (1) input of two input NAND gate G2. The output of NAND gate G2 is connected to the gate electrodes of transistors P2a and N2a.

A control (or chip select) signal denoted CS generated by an external source (not shown) is applied to the two (2) inputs of gates G1 and G2. When CS is low the outputs, $V_{G1}$ and $V_{G2}$, respectively, of G1 and G2 are held high and inhibit the generation of pulses at output 22 which then remains low. For $V_{G1} = V_{G2} =$ high, P2a and P2b are off and whether $V_{IN}$ is high or $V_{IN}$ is low, either N1a and N2a are on or N1b and N2b are on. In the operation of the circuit to follow it is assumed that CS is "high" enabling pulses to be generated at the circuit output 22 for every transition of the address signal.

To better understand the description of the operation to follow certain characteristics of the components of the circuit are detailed.

Inverter I1 as shown in FIG. 2 is a complementary inverter comprised of a transistor P11 whose conduction path is connected in series with a transistor N11 between $V_{DD}$ and ground. The gates of P11 and N11 are connected to the inverter input and their drains are connected to the inverter output. Transistor N11 is made much larger than transistor P11 whereby the switching (or "Trip") point of inverter I1 is very close to the threshold voltage ($V_{TN}$) of N11 which, for example, may be 1 volt. Therefore, the output voltage (V1) of I1 goes from high-to-low very quickly after the input to I1 rises just above $V_{TN}$ volts. Since N11 is a very large transistor it can discharge the capacitance at its output very quickly to ground. V1 goes from low-to-high only after the input to I1 falls below $V_{TN}$ volts and then, since P11 is a small device, it will take a relatively long time to charge the capacitance at its output to $V_{DD}$ volts. Therefore, I1 is "skewed" in that it responds much faster in one direction than in the other.

Inverter I2, which is a complementary inverter comprised of P and N transistor as shown schematically in FIG. 2A, functions as a bilateral delay network. This is accomplished by making its P and N devices very small. Hence, the impedance (Z) of the conduction paths of its P and N transistors are relatively (equally) high even when the transistors are turned on. Thus, the output of I2 which is the inverse of its input, will be significantly delayed with respect to its input. By way of example, the delay produced by I2 (which is significantly longer than any delay produced by I1) is in the range of 30 nanoseconds.

In the two strings (11a, 11b) of transistors the P type devices are four to five times larger than the N type devices. The P type devices, therefore, tend to respond earlier (for equal $V_{GS}$) and to have greater current passing capability than the N-type transistors. Since the impedance (Z) of a transistor is a function of the width to length ratio (W/L) larger devices have smaller Z's hence higher conductivity for any given value of gate-to-source potential ($V_{GS}$). In the discussion to follow the impedances (Z) of the various transistors will be identified by the letter Z followed by (or subscripted by) the reference character of the transistor.

The operation of the circuit will be examined first for the condition when the input signal ($V_{IN}$) is at 0 volts or low, then for the condition when $V_{IN}$ makes a transition from low to high (or $V_{DD}$ volts), then for the condition when $V_{IN}$ is high, and finally for the condition when $V_{IN}$ makes a transition from high to low.

(a) When $V_{IN}$ is low, V1 is at $V_{DD}$. P1a and N1a are turned off, P1b and N1b are turned on, the output of I2 (V12) is low and $V_{G1}$ is high. Therefore, N2b is turned on and P2b is turned off. $V_{G2}$ is low P2a is turned on while N2a is turned off. The voltage $V_0$ at output 22 is held at ground due to the clamping action of transistors N1b and N2b which are on.

Note that in each one of strings 11a and 11b one of the two P transistors is on while the other is off. Therefore, no low impedance conduction path exists between terminals 20 and 22.

(b) Assume now that the address signal makes a positive going transition at time $t_0$ as shown in Waveform A of FIG. 3.

As soon as $V_{IN}$ is somewhat more positive than the $V_{TN}$ of N11 of I1, V1 goes low, as shown for time $t_1$. P1a (a large device) is turned on almost immediately while N1b (a small device) is being turned off. Since P2a is already on, p1a and P2a provide a relatively low impedance between terminals 20 and 22 and pull $V_0$ towards $V_{DD}$. There is also a conduction path between terminal 22 and ground since N2b is still on and N1b although being turned off is still on. But, P1a and P2a are much larger devices than N1b and N2b and can drive $V_0$ well above $V_{DD}/2$ even if N2b were not being turned off. Assuming $Z_{N1a} = Z_{N1b} = 4Z_{P1b} = 4Z_{P2b}$ (for equal values of $V_{GS}$), then $V_0$ would rise to 0.8 $V_{DD}$. Since N2b is being turned off its impedance is still higher than $4Z_{P1a}$ and P1a and P2a can drive $V_0$ close to $V_{DD}$. Also, since the impedances of N1b and N2b are high and since they are on for only a short period of time, as discussed below, there is little power dissipation.

The output (V12) of I2 responds slowly to the high-to-low transition at its input. But after a time delay ($t_d$) the output of I2 as shown for time $t_3$ in waveform C of FIG. 3 goes high causing $V_{G1}$ to go low. This causes N2b to be turned off and P2b to be turned on. $V_{G1}$ low causes $V_{G2}$ to go high which turns off P2a and turns on N2a. The turn off of P2a terminates the positive going pulse produced at $V_0$ (at time $t_4$) and the low impedance conduction path produced by P1a and P2a between terminals 22 and 20. Concurrently, P1b is being turned off by the positive going input signal transition. With P2a turned off, N1a and N2a which are turned on can quickly discharge the output terminal to ground. Therefore, a pulse is produced as soon as the amplitude of the positive going transition of $V_{IN}$ is more positive than a predetermined ($V_{TN}$) threshold level.

In the operation of the circuit, it should be noted that $V_{IN}$ is applied to the gate electrode of P1b and that V1 which is equal to the inverse of $V_{IN}$ is applied to the gate of P1a. Thus, when $V_{IN}$ is high P1a is turned on and P1b is turned off and when $V_{IN}$ is low P1a is turned off and P1b is turned on.

V1 which is delayed and inverted by I2 and then inverted by G1 is applied to the gate electrode of P2b. Consequently, after a time delay ($T_{D1}$) the inverse of the signal applied to the gate electrode of P1b is applied to the gate electrode of P2b. Since P1b and P2b are of the same conductivity type they can both conduct only during the delay time interval.

(c) when $V_{IN}$ is high, V1 is low. P1a and N1a are turned ON, P1b and N1b are turned off. VI2 is high and $V_{G1}$ is low. Therefore, P2b is on and N2b is off. $V_{G2}$ is high turning on N2a and turning off P2a. $V_O$ is held at ground due to the conduction of N1a and N2a. Note that in string 11a, P1a is on while P2a is off and that in string 11b, P1b is off while P2b is on.

Analysis of the signal propagation loop indicates that in the steady state condition (when $V_{IN}$ is high or low) the signal applied to the gate of P2b is the complement of the signal applied to the gate of P1b and the signal applied to the gate of P2a is the complement of the signal applied to P1a. Therefore, in the steady state condition, one of the P transistors in each string is turned off and the other one is turned on. Thus, whenever P1a or P1b is turned off the other P transistor in series with it is turned on. Consequently, whenever P1a or P1b is then turned on no P transistor (P2a or P2b) other than the transistor (P1a or P1b) being turned on must be switched on to generate a low impedance path between $V_{DD}$ and terminal 22. Hence, very high speed of response is possible to an input signal transition as further discussed below.

(d) Assume now that $V_{IN}$ makes a negative going transition from high to low.

As soon as $V_{IN}$ decreases slightly more than $V_{TP}$ volts below $V_{DD}$ volts, where $V_{TP}$ is the threshold voltage of transistor P1b, the latter turns on. Since P2b is already on, P1b and P2b drive the output towards $V_{DD}$ even if N1a and N2a are on. Recall that N1a are small devices and note further that with $V_{IN}$ decreasing N1a is being turned off. Thus, although P1b and P2b do not clamp $V_O$ to $V_{DD}$ they immediately raise $V_O$ close to $V_{DD}$ since the conductance of P1b and P2b is much greater than the conductance of N1a and N2a. Thus, a positive going pulse is produced at the output terminal 22 (at time $t_5$) very soon after $V_{IN}$ starts making a negative going transition.

For the case of the negative going transition, $V_O$ remains high for a period which includes the time ($t_5$ to $t_6$ identified as the $T_s$ delay) for the negative going transition of $V_{IN}$ to reach the $V_{TN}$ of N11 (the switching logic level of the input signal) plus the time delay of I1 and I2; with the delay of the latter assumed to be dominant.

When $V_{IN}$ drops just below $V_{TN}$ the output of I1 switches from low to high at time $t_6$. This immediately turns off P1a and turns on N1b (but P1b and P2b remain on). After a time delay, I2 responds and VI2 goes low at time $t_7$ causing $V_{G1}$ to go high. Consequently, P2b turns-off terminating conduction in string 11b between $V_{DD}$ and terminal 22. N2b turns on and since N2b is already on they quickly discharge the output to ground potential. $V_{G1}$ high causes $V_{G2}$ to go low turning on P2a and turning off N2a. Thus, string 11a is set up for the next (possible) positive going transition of the input signal and the circuit is restored to the steady state condition described above for $V_{IN}=0$.

Similarly to the case of the positive going transition it should be noted that, after a time delay the signal ($V_{G2}$) applied to the gate of P2a is the inverse of the signal (V1) applied to the gate of P1a. Therefore, P1a and P2a can both conduct only during the time delay interval.

The pulses produced at output terminal 22 are applied to a load circuit 15 which then drives other parts (not shown) of a memory array.

In the circuit of FIG. 1 there is early sensing of a positive going transition and early sensing of a negative going transition. However, the output pulse produced in response to the negative going transition is maintained for a longer period of time than the output pulse produced for the positive going transition. The skewing of I1 causes $V_0$ to be held high for a longer period of time on the falling edge of $V_{IN}$.

The circuit, as designed, accomodates a transistor-transistor-logic (TTL) level, whose input swings varies typically between 0.8 volts and 2.4 volts. For ease of discussion it is assumed that signals below 1.0 volt define the logic "0" condition and signals above 1.0 volts define the logic "1" condition. The circuit of FIG. 1 is, therefore, designed to switch around the 1 volt level.

On the positive going transition as soon as the $V_{TN}$ of N11 (and N1a) is reached (which is assumed to be 1 volt) the switching level of the input signal is also reached and an output signal is produced. On the negative going transition, as soon as $V_{IN}$ decreases below [$V_{DD}$—$V_{TP}$] volts a positive pulse indicative of a negative going transition is produced. However, this transition detection level (i.e., $V_{DD}$—$V_{TP}$) is above the switching level (e.g. 1 volts) of the circuit and it is not definite when $V_{IN}$ is at $V_{DD}$—$V_{TP}$ whether a zero level is being applied to the address line 12. Therefore, the positive $V_0$ pulse is maintained from the time that $V_{IN}$ is equal to $V_{DD}$—$V_{TP}$ until $V_{IN}$ equals the switching logic level (plus the built-in time delay). This design feature enables a precharge pulse to be generated early and to be routed to various portions of a memory system in advance of an actual data signal being valid.

In the circuit of FIG. 1 complementary transistors are used. But, the circuit could function with the N transistors shown replaced by switched or constant load connected between terminal 22 and ground and with the rest of the circuitry of FIG. 1 remaining as shown. Transistors P1a, P2a, P1b and P2b would still function to produce a pulse at output 22 for each transition of the input signal. However, depending on the type of load the power dissipation might be greater than than for the circuit of FIG. 1.

It should be evident that the P type transistors could be replaced by other types of switching means while still enabling transition detection to be performed. For example, transistors P1a and P2a could be replaced by a device having a single conduction channel with two control electrodes. This, of course, assumes that for one signal condition (e.g. when an enabling signal is applied to both control electrodes) a current of one value can be made to flow through the conduction channel and that for other signal conditions (e.g. when a disabling signal is applied to either one or both of the control electrodes) a current of another value (or no current) can flow through the conduction channel.

It is also evident that the relative series order of P1b, P2b, or P1a, P2a, or N2b, N1b or N2a, N1a is immaterial since both devices in series must be on to form a conduction path through the pair.

In the circuit of FIG. 1 aysmmetrical sensing is described. It should be understood, however, that the detection of an input transition and the production of a corresponding indication (output pulse) can be set at virtually any point between $V_{TN}$ and $V_{DD}$—$V_{TP}$.

In the circuit of FIG. 1 the output is normally grounded and positive output pulses are produced during output signal transitions. It should be evident that the circuit may be modified so that the output is normally at $V_{DD}$ and negative going output pulses are produced during input signal transitions.

What is claimed is:

1. The combination comprising:
   an input terminal adapted to receive input signals having a first or a second value;
   a first point of operating potential;
   an output point;
   first and second signal paths connected in parallel between said first point and said output point; each path including first and second switching means and each path providing a relatively low impedance path between said first and output points when its two switching means are enabled; and
   means coupled between said input terminal and said first and second switching means of said first and second signal paths responsive to the signal at said input terminal for:
   (a) enabling said first switching means of said first path and disabling said first switching means of said second path for one value of input signal and disabling said first switching means of said first signal path and enabling said first switching means of said second signal path for the other value of input signal; and
   (b) disabling the second switching means of each signal path a first time delay after the first switching means of that path is enabled, and enabling the second switching means of each signal path a second time delay after the first switching means of that path is disabled.

2. The combination as claimed in claim 1 wherein each one of said switching means is a transistor having first and second electrodes defining the ends of a conduction path and a control electrode.

3. The combination as claimed in claim 2 further including a second point of operating potential and means coupled between said output point and said second point of operating potential for selectively providing a conduction path therebetween.

4. The combination as claimed in claim 1 wherein said first and second switching means of said first signal path are first and second transistors, respectively, and wherein said first and second switching means of said second signal path are third and fourth transistors, respectively;
   further including:
   a second point of operating potential;
   fifth, sixth, seventh, and eighth transistors; each transistor having a conduction path and a control electrode;
   means connecting the conduction paths of said fifth and sixth transistors in series between said output point and said second point;
   means connecting the conduction paths of said seventh and eighth transistors in series between said output point and said second point;
   means coupled to the control electrodes of said fifth, sixth, seventh, and eighth transistors for:
   (a) concurrently enabling and disabling said first and fifth transistors;
   (b) concurrently enabling and disabling said third and seventh transistors;
   (c) disabling said sixth transistor when said second transistor is enabled and enabling said sixth transistor when said second transistor is disabled; and
   (d) disabling said eight transistor when said fourth transistor is enabled and enabling said eighth transistor when said fourth transistor is disabled.

5. The combination as claimed in claim 4 wherein each one of said first, second, third, and fourth transistors is of one conductivity type, and
   wherein each one of said fifth, sixth, seventh, and eighth transistors is of opposite, to said one, conductivity type; and
   wherein said means coupled between said input terminal and said switching means of said first and second signal paths and said means coupled to the control electrodes of said fifth, sixth, seventh, and eighth transistors include:
   means for coupling the control electrodes of said first and seventh transistors to said input terminal,
   a first inverter connected at its input to said input terminal and at its output to said third and fifth transistors;
   a controlled delay network connected between the output of said inverter and the control electrodes of said second and sixth transistors; and
   an inverting means connected between the output of said controlled delay network and the control electrodes of said fourth and eighth transistors.

6. The combination as claimed in claim 5 wherein said controlled delay network includes:
   a high impedance inverter whose output is effectively delayed with respect to its input, and a first two input logic gate, one input of the first logic gate being connected to the output of the high impedance inverter, and a control signal being applied to the other input of the first logic gate; and
   wherein said inverting means is a second two input logic gate, one of whose inputs is connected to the output of the first logic gate and to the second of whose inputs is applied said control signal.

7. In a circuit in which there are first and second transistors connected in series between a first point of operating potential and an output point and third and fourth transistors connected in series between said first and output points, and to which there is applied an input signal whose transitions between first and second levels are to be sensed the improvement comprising:
   means responsive to said input signal coupled to said first, second, third and fourth transistors for:
   (a) turning on said first transistor and turning off said third transistor for one value of said input signal and for turning off said first transistor and turning on said third transistor for the other value of said input signal;
   (b) turning off said second transistor a first time period after said first transistor is turned on and for turning it on a second time period after said first transistor is turned off; and
   (c) for turning off said fourth transistor a third time period after said third transistor is turned on and for turning it on a fourth time period after said third transistor is turned off.

8. A circuit for detecting the transitions of an input signal between first and second levels, comprising:
   an input terminal adapted to receive said input signal;
   first and second points of operating potential,
   an output point;
   first, second, third and fourth transistors, each transistor having a conduction path and a control electrode;

means connecting the conduction paths of said first and second transistors in series between said first point and said output point;
means connecting the conduction paths of said third and fourth transistors in series between said first and said output point;
means connected between said output point and said second point for selectively providing a conduction path therebetween;

means coupling said input terminal to the control electrode of said first transistor;
inverting means coupled between said input terminal and the control electrode of said third transistor;
delay means coupled between the control electrode of said third transistor and the control electrode of said second transistor; and
inverting means coupled between the control electrode of said third transistor and the control electrode of said fourth transistor.

* * * * *